US008089107B2

(12) United States Patent
Okubora

(10) Patent No.: US 8,089,107 B2
(45) Date of Patent: Jan. 3, 2012

(54) THREE-DIMENSIONAL INTEGRATED DEVICE

(75) Inventor: Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 71 days.

(21) Appl. No.: 11/715,161

(22) Filed: Mar. 7, 2007

(65) Prior Publication Data
US 2007/0215913 A1    Sep. 20, 2007

(30) Foreign Application Priority Data

Mar. 14, 2006 (JP) ................ P2006-069545

(51) Int. Cl.
H01L 29/66 (2006.01)
(52) U.S. Cl. ............. 257/275; 257/E23.29; 333/246; 343/770
(58) Field of Classification Search ........... 257/678, 257/475, 724, 728, 778, E29.23, E29.231, 257/275, E29.29; 333/246; 343/770
See application file for complete search history.

(56) References Cited

U.S. PATENT DOCUMENTS

| 5,872,545 | A * | 2/1999 | Rammos | 343/770 |
| 6,087,989 | A * | 7/2000 | Song et al. | 343/700 MS |
| 6,333,552 | B1 * | 12/2001 | Kakimoto et al. | 257/728 |
| 6,535,090 | B1 * | 3/2003 | Matsuzuka et al. | 333/246 |
| 6,717,229 | B2 * | 4/2004 | Buchanan et al. | 257/475 |
| 6,888,420 | B2 * | 5/2005 | Schaffner et al. | 333/101 |
| 6,998,708 | B2 * | 2/2006 | Ammar | 257/724 |
| 7,045,901 | B2 * | 5/2006 | Lin et al. | 257/778 |
| 2005/0156755 | A1 | 7/2005 | Miller et al. | |
| 2006/0076658 | A1 * | 4/2006 | Wu | 257/678 |

FOREIGN PATENT DOCUMENTS

| JP | 64-059845 | 3/1989 |
| JP | 08-236696 | 9/1996 |
| JP | 09-326631 | 12/1997 |
| JP | 11-186458 | 7/1999 |
| JP | 11-261308 | 9/1999 |
| JP | 2002-198742 | 7/2002 |

OTHER PUBLICATIONS

Iwatawa et al., "A 3D Integration Scheme utilizing Wireless Interconnection for Implementing Hyper Brains", 2005 IEEE International Solid-State Circuits Conference, p. 262-263, 597.

(Continued)

Primary Examiner — Matthew E Warren
Assistant Examiner — Fang-Xing Jiang
(74) Attorney, Agent, or Firm — Robert J. Depke; Rockey, Depke & Lyons, LLC

(57) ABSTRACT

A three-dimensional integrated device includes at least two integrated circuit substrates laminated to each other, each of the integrated circuit substrates having at least one ground plane, at least one aperture provided at a desired location in the ground plane, the end of a microstrip line formed in a pair with the ground plane and placed in the aperture, and a transmitter and/or a receiver that is connected to the microstrip line and transmits and/or receives signals at a frequency substantially corresponding to the perimeter $\lambda$ of the aperture. Each of the apertures in each of the integrated circuit substrates is superimposed on at least one of the apertures in the other integrated circuit substrates in the direction perpendicular to the ground planes, and the signals are transported in a contactless manner between the integrated circuit substrates through the apertures at a frequency substantially corresponding to the perimeter $\lambda$ of the apertures.

8 Claims, 5 Drawing Sheets

OTHER PUBLICATIONS

Miura et al., "A 195Gb/s 2.1W 3D-Stacked Inductive Iinter-chip Wireless Superconnect with Transmit Power Control Scheme", 2005 IEEE International Solid-State Circuits Conference, p. 263-265, 597.

Luo et al., "3Gb/s AC-Coupled Chip-to-Chip Communication Using a Low-Swing Pulse Receiver", 2005 IEEE International Solid-State Circuits Conference, p. 522-523, 614.

A 3D Integration Scheme utilizing Wireless Interconnections for Implementing Hyper Brains.

A 195Gb/s 1.2W 3D-Stacked Inductive Inter-Chip Wireless Superconnect with Transmit Power Control Scheme.

3Gb/s AC-Coupled Chip-to-Chip communication using a Low-Swing Pulse Receiver.

Schuster et al.; An Interconnected 2D-TM EBG Structure for Millimeter and Submillimeter Waves; IEEE Journal; vol. 23, No. 7, Jul. 2000.

Li et al.; Amplification Properties of Erbium-Doped Solid-Core Photonic Bandgap Fibers; IEEE Photonics Technology Letters; vol. 17, No. 2; Feb. 2005.

* cited by examiner

… (1)

THREE-DIMENSIONAL INTEGRATED DEVICE

CROSS REFERENCES TO RELATED APPLICATIONS

The present invention contains subject matter related to Japanese Patent Application JP 2006-069545 filed in the Japanese Patent Office on Mar. 14, 2006, the entire contents of which being incorporated herein by reference.

BACKGROUND OF THE INVENTION

1. Field of the Invention

The invention relates to a three-dimensional integrated device formed of a plurality of integrated circuit substrates laminated to each other, and particularly to a three-dimensional integrated device suitably used in a system that integrates various functions, such as a memory CPU function, an imaging element and signal processing device function, and a communication function.

2. Description of the Related Art

In recent years, due to the advance of high integration and acceleration in operating frequency of LSIs along with increase in the number of I/O lines in the LSIs, various problems have become increasingly serious, such as limitation of wiring physical signal lines, degradation of signal quality (degradation of waveforms) and increase in power consumption in signal I/O sections.

The following approaches using electromagnetic waves have been investigated:

(1) Approach in which an antenna is provided on a chip (for example, see 2005 IEEE International Solid-State Circuits Conference Proceedings, Atsushi Iwata, Mamoru Sasaki, Takamaro Kikkawa, Seiji Kameda, Hiroshi Ando, Kentaro Kimoto, Daisuke Arizono, Hideo Sunami, "A 3D Integration Scheme utilizing Wireless Interconnections for Implementing Hyper Brains", 2005 IEEE International Solid-State Circuits Conference, pp. 262-263, which is hereinafter referred to as the non-patent document 1)

(2) Approach in which electromagnetic coupling between inductors is used (for example, see 2005 IEEE International Solid-State Circuits Conference Proceedings, Noriyuki Miura[1], Daisuke Mizoguchi[1], Mari Inoue[1], Hiroo Tsuji[1], Takayasu Sakurai[2], Tadahiro Kuroda[1], "A 195 GB/s 1.2 W 3D-Stacked Inductive Inter-Chip Wireless Superconnect with Transmit Power Control Scheme", 2005 IEEE International Solid-State Circuits Conference, pp. 264-265, which is hereinafter referred to as the non-patent document 2)

(3) Method in which capacitor coupling using opposing pads is used (for example, see 2005 IEEE International Solid-State Circuits Conference Proceedings, Lei Luo, John M. Wilson, Stephen E. Mick, Jian Xu, Liang Zhang, Paul D. Franzon, "3 Gb/s AC-Coupled Chip-to-Chip Communication using a Low-Swing Pulse Receiver", 2005 IEEE International Solid-State Circuits Conference, pp. 522-523, which is hereinafter referred to as the non-patent document 3)

SUMMARY OF THE INVENTION

However, the approach in which an antenna is provided on a chip as described in the non-patent document 1 has a fundamental problem that the output originated from one LSI via the antenna disadvantageously induces a current in wiring in the LSI. The method described in the non-patent document 3 can work with coupling corresponding to two LSIs, but has difficulty in reliably extending to the case where three or more LSIs are laminated or a problem of increased power consumption depending on the size of the capacitor. The non-patent document 2 has a problem of interference between vertically or horizontally adjacent inductors.

Furthermore, when the thus configured three-dimensional LSI is mounted on a board, there is a problem of unnecessary emission toward other LSIs mounted on the board, wiring on the board or the outside of the apparatus in which the three-dimensional LSI is mounted.

In view of the above problems of the related art, it is desirable to solve a number of problems associated with the connection between multi-pin and small-pitched LSIs.

It is also desirable to solve the problems of interference on a LSI, interference between wireless channels as well as interference with other LSIs and wiring on a board, which have been the biggest problems for wireless connection.

Other objects of the invention and specific advantages obtained therefrom will become more apparent from the following description of embodiments.

A three-dimensional integrated device according to an embodiment of the invention includes at least two integrated circuit substrates laminated to each other, each of the integrated circuit substrates having at least one ground plane, at least one aperture provided at a desired location in the ground plane, the end of a microstrip line formed in a pair with the ground plane and placed in the aperture, and a transmitter and/or a receiver that is connected to the microstrip line and transmits and/or receives signals at a frequency substantially corresponding to the perimeter $\lambda$ of the aperture. Each of the apertures in each of the integrated circuit substrates is superimposed on at least one of the apertures in the other integrated circuit substrates in the direction perpendicular to the ground planes. The signals are transported in a contactless manner between the integrated circuit substrates through the apertures at a frequency substantially corresponding to the perimeter $\lambda$ of the apertures.

In the three-dimensional integrated device according to the embodiment of the invention, at least one of the integrated circuit substrates has a pattern formed therein, the pattern having a periodic structure created according to a genetic algorithm. The period of the pattern is about $\lambda/4$.

In the three-dimensional integrated device according to the embodiment of the invention, the periodic structure is formed at the bottom of the silicon substrate, and the pattern in a conductive portion of the silicon substrate is created by utilizing the change in carrier concentration of the silicon substrate itself.

In the three-dimensional integrated device according to the embodiment of the invention, one end of the microstrip line connected to the transmitter and one end of the microstrip line connected to the receiver are formed in each of the apertures, and when one of the integrated circuit substrates functions as the signal transmission side, the other integrated circuit substrates function as the reception side.

In the three-dimensional integrated device according to the embodiment of the invention, each of the integrated circuit substrates has an aperture where one end of the microstrip line connected to the transmitter is formed and an aperture where one end of the microstrip line connected to the receiver is formed. Each of the integrated circuit substrates functions as the signal transmission side and the signal reception side, so that one of the integrated circuit substrates successively transports signals to the other integrated circuit substrates.

In the three-dimensional integrated device according to the embodiment of the invention, each of the integrated circuit substrates is formed of a silicon substrate having at least one through via for power supply and ground wiring, and the integrated circuit substrates are laminated to each other through bumps electrically connected to the through via.

According to an embodiment of the invention, a simple circuit can be used to transport signals between the chips on laminated LSIs without metallic bonding, thereby solving a number of problems associated with the connection between multi-pin and small-pitched LSIs.

For example, it is possible to significantly enhance the reliability of signal I/O between laminated chips, which otherwise suffer from increasingly higher connection cost and increasingly reduced reliability.

While it is necessary to give consideration to the problems, such as signal integrity at I/O sections in LSIs operating at higher speed, wireless configuration can significantly reduce the number of implementation design steps.

The tree-dimensional configuration using wireless transportation described above can be achieved at significantly low cost without costly processes, such as bump formation and through hole formation. The three-dimensional configuration can also significantly reduce the length of signal lines between LSI chips, so that wiring load and power consumption at I/O sections can be reduced. Furthermore, the three-dimensional configuration is significantly advantageous in terms of signal transportation distortion.

According to the embodiments of the invention, it is possible to solve the problems of interference on a LSI, interference between wireless channels as well as interference with other LSIs and wiring on a board, which have been the biggest problems in wireless connection of related art.

DESCRIPTION OF THE PREFERRED EMBODIMENTS

Embodiments of the invention will be described below in detail with reference to the drawings. The invention is of course not limited to the following examples but changes can be arbitrarily made as far as they do not depart from the spirit of the invention.

Figure 1:
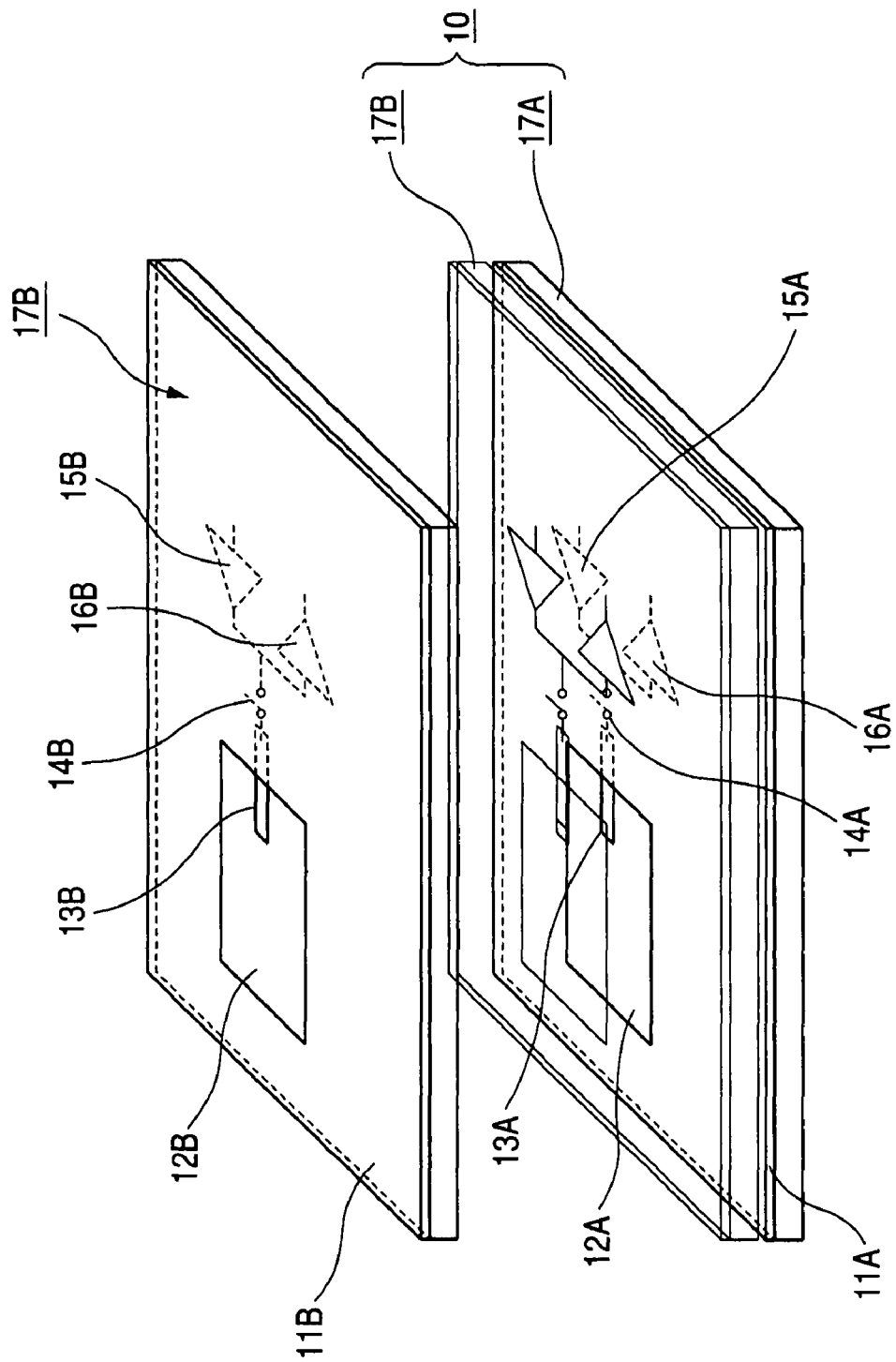
FIG. 1 is a perspective view diagrammatically showing an exemplary configuration of the three-dimensional integrated device to which the invention is applied.

The invention is applied to a three-dimensional integrated device 10, for example, configured as shown in FIG. 1.

The three-dimensional integrated device 10 shown in FIG. 1 includes two integrated circuit substrates 17A and 17B laminated to each other, each of which is formed of a silicon substrate. Each of the integrated circuit substrates 17A and 17B has one ground plane, that is ground planes 11A and 11B, as well as one aperture, that is apertures 12A and 12B provided at desired locations in the ground planes 11A and 11B.

The integrated circuit substrates 17A and 17B also have open ends of microstrip lines 13A and 13B formed in pairs with the ground planes 11A and 11B and placed in the apertures 12A and 12B, and transmitters 15A, 15B and receivers 16A, 16B that are selectively connected to the microstrip lines 13A and 13B via switches 14A and 14B and transmit and receive signals at a frequency substantially corresponding to the perimeter λ of the apertures 12A and 12B. The apertures 12A and 12B in the integrated circuit substrates 17A and 17B are disposed at the locations where the apertures are superimposed on each other in the direction perpendicular to the ground planes 11A and 11B.

In the thus configured three-dimensional integrated device 10, the apertures 12A and 12B where the open ends of the microstrip lines 13A and 13B are located function as so-called slot antennas, so that the transmitters 15A, 15B and receivers 16A, 16B can be used to transport signals in a contactless manner between the integrated circuit substrates 17A and 17B through the apertures 12A and 12B at the frequency substantially corresponding to the perimeter λ of the apertures 12A and 12B.

That is, in the three-dimensional integrated device 10, the microstrip lines 13A, 13B and the apertures 12A, 12B where the open ends of the microstrip lines 13A, 13B are located function as communication elements that transmit and receive signals at the frequency substantially corresponding to the perimeter λ of the apertures 12A and 12B.

The communication elements is configured to resonate at a frequency corresponding to the perimeter λ of the apertures 12A and 12B in the ground planes 11A and 11B ($\lambda_e = \lambda/\sqrt{(\epsilon \times \mu)}$, where $\epsilon$ and $\mu$ are the dielectric constant and the magnetic permeability of the medium, respectively) and are particularly useful in the microwave band (approximately higher than 5 GHz) or higher.

The apertures 12A and 12B may have an elongated slit-like shape or a rectangular shape, or may have no definite shape. When the effective dielectric constant and magnetic permeability of the dielectric material that forms the apertures are both 4.1 and the shape is a square, the length of one side of the square is about 3.75 mm for a transmission frequency of 10 GHz, 1.25 mm for 30 GHz and 0.625 mm for 60 GHz. A plurality of such communication elements can be juxtaposed on the LSI.

Figure 2:
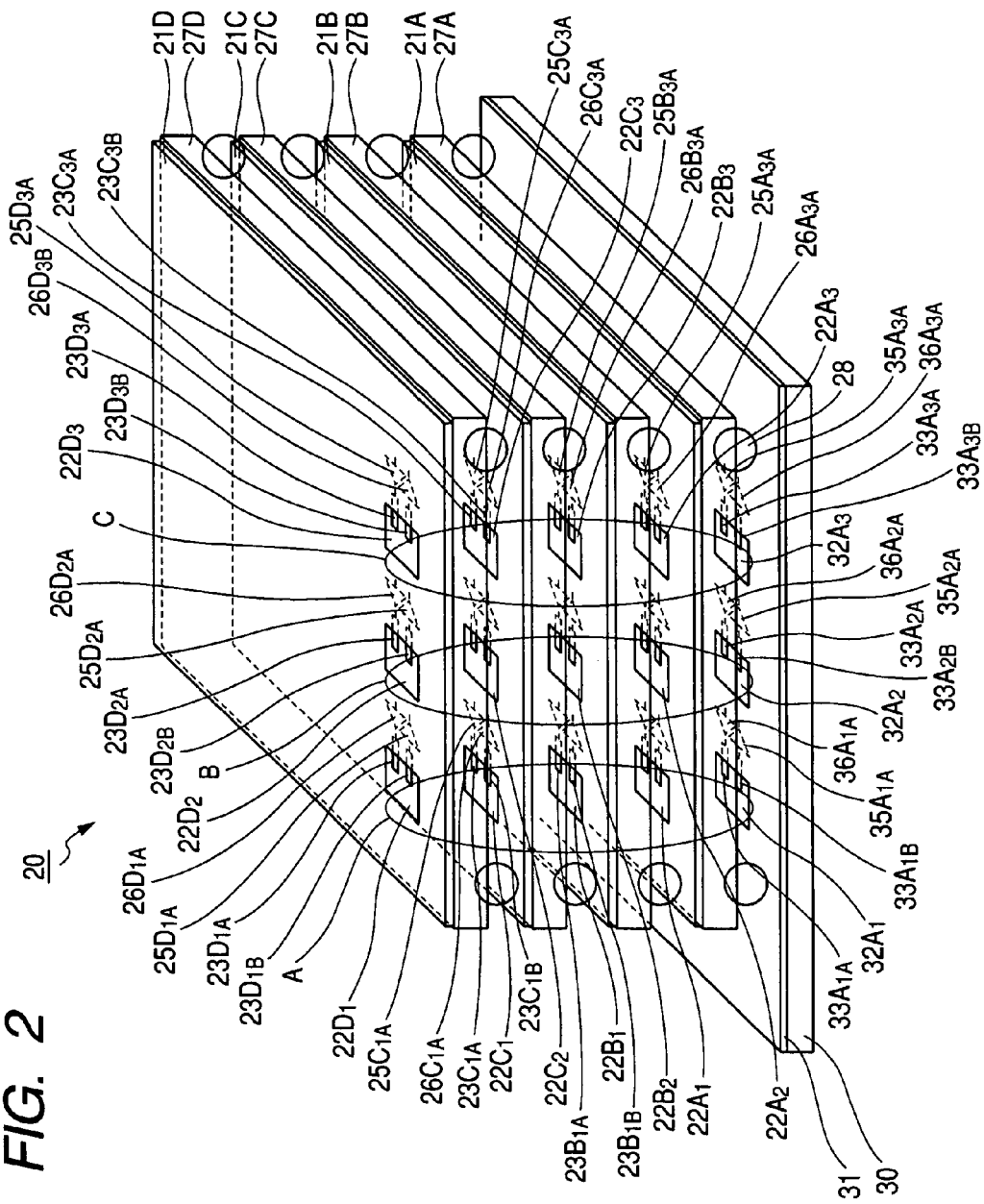
FIG. 2 is a perspective view diagrammatically showing another exemplary configuration of the three-dimensional integrated device to which the invention is applied.

By juxtaposing a plurality of the communication elements on the LSI, for example, as shown in FIG. 2, a three-dimensional integrated device 20 having a wireless shared-bus configuration can be formed.

The three-dimensional integrated device 20 shown in FIG. 2 includes four integrated circuit substrates 27A, 27B, 27C and 27D laminated to each other. Each of the integrated circuit substrates 27A, 27B, 27C and 27D have one ground plane, that is ground planes 21A, 21B, 21C and 21D, respectively. The integrated circuit substrates 27A, 27B, 27C and 27D also have three apertures $22A_1$ to $22A_3$, $22B_1$ to $22B_3$, $22C_1$ to $22C_3$ and $22D_1$ to $22D_3$ provided at desired locations in the ground planes 21A, 21B, 21C and 21D, open ends of two microstrip lines formed in pairs with the ground planes 21A, 21B, 21C and 21D and placed in the apertures $22A_1$ to $22A_3$, $22B_1$ to $22B_3$, $22C_1$ to $22C_3$ and $22D_1$ to $22D_3$, that is, $23A_{1A}$, $23A_{1B}$ to $23A_{3A}$, $23A_{3B}$; $23B_{1A}$, $23B_{1B}$ to $23B_{3A}$, $23B_{3B}$; $23C_{1A}$, $23C_{1B}$ to $23C_{3A}$, $23C_{3B}$; and $23D_{1A}$, $23D_{1B}$ to $23D_{3A}$, $23D_{3B}$, and transmitters $25A_{1A}$ to $25A_{3A}$, $25B_{1A}$ to $25B_{3A}$, $25C_{1A}$ to $25C_{3A}$ and $25D_{1A}$ to $25D_{3A}$ that are connected to the microstrip lines $23A_{1A}$ to $23A_{3A}$, $23B_{1A}$ to $23B_{3A}$, $23C_{1A}$ to $23C_{3A}$ and $23D_{1A}$ to $23D_{3A}$ and transmit signals at a frequency substantially corresponding to the perimeter λ of the apertures $22A_1$ to $22A_3$, $22B_1$ to $22B_3$, $22C_1$ to $22C_3$ and $22D_1$ to $22D_3$ and receivers $26A_{1A}$ to $26A_{3A}$, $26B_{1A}$ to $26B_{3A}$, $26C_{1A}$ to $26C_{3A}$ and $26D_{1A}$ to $26D_{3A}$ that are connected to the microstrip lines $23A_{1B}$ to $23A_{3B}$, $23B_{1B}$ to $23B_{3B}$, $23C_{1B}$ to $23C_{3B}$ and $23D_{1B}$ to $23D_{3B}$ and receive signals at the frequency substantially corresponding to the perimeter λ of the apertures $22A_1$ to $22A_3$, $22B_1$ to $22B_3$, $22C_1$ to $22C_3$ and $22D_1$ to $22D_3$. The apertures $22A_1$ to $22A_3$, $22B_1$ to $22B_3$, $22C_1$ to $22C_3$ and $22D_1$ to $22D_3$ in the integrated circuit substrates 27A, 27B, 27C and 27D are disposed at the locations where the apertures are superimposed on each other in the direction perpendicular to the ground planes 21A, 21B, 21C and 21D.

The integrated circuit substrates 27A, 27B, 27C and 27D are formed of silicon substrates having at least one through vias (not shown) for power supply and ground wiring. The integrated circuit substrates 27A, 27B, 27C and 27D are laminated to each other with interposed bumps 28 electrically connected to the through vias.

In the three-dimensional integrated device 20 configured as shown in FIG. 2, the integrated circuit substrates 27A, 27B, 27C and 27D are configured such that the three sets $22A_1$ to $22D_1$, $22A_2$ to $22D_2$ and $22A_3$ to $22D_3$ vertically superimposed on each other function as communication channels A, B and C, each of which is capable of individually sending and receiving signals. For example, when the transmitters $25A_{1A}$ to $25A_{3A}$ of the integrated circuit substrate 27A are turned on, any one of the receivers $26B_{1A}$ to $26B_{3A}$, $26C_{1A}$ to $26C_{3A}$ or $26D_{1A}$ to $26D_{3A}$ of the integrated circuit substrates 27B, 27C and 27D can be turned on to receive the signal originated from the integrated circuit substrate 27A at the integrated circuit substrate that has been turned on. Alternatively, when the transmitters $25A_{1A}$ to $25A_{3A}$ of the integrated circuit substrate 27A are turned on, all receivers $26B_{1A}$ to $26B_{3A}$, $26C_{1A}$ to $26C_{3A}$ and $26D_{1A}$ to $26D_{3A}$ of the integrated circuit substrates 27B, 27C and 27D can be turned on. In this case, the integrated circuit substrates 27B, 27C and 27D can be operated in a simultaneous reception mode and hence in a BUS operation mode of related art.

Moreover, the three sets of communication channels A, B and C in the three-dimensional integrated device 20 can independently send and receive signals.

The three-dimensional integrated device 20 can be mounted on a circuit substrate 30 having one ground plane 31, three apertures $32A_1$ to $32A_3$ provided at desired locations in the ground plane 31, open ends of two microstrip lines $33A_{1A}$ and $33A_{1B}$ formed in a pair with the ground plane 31 and placed in the apertures $32A_1$ to $32A_3$, and transmitters $35A_{1A}$ to $35A_{3A}$ that are connected to the microstrip line $33A_{1A}$ and transmit signals at a frequency substantially corresponding to the perimeter λ of the apertures $32A_1$ to $32A_3$ and receivers $36A_{1A}$ to $36A_{3A}$ that are connected to the microstrip line $33A_{1B}$ and receive signals at the frequency substantially corresponding to the perimeter λ of the apertures $32A_1$ to $32A_3$, so as to use the three sets of communication channels A, B and C to send and receive signals between the circuit substrate 30 and the integrated circuit substrates 27A, 27B, 27C and 27D.

Although in the three-dimensional integrated device 20 shown in FIG. 2, two microstrip lines are disposed in one aperture and connected to the transmitters and receivers, respectively, a switch provided in the LSI is used to share one microstrip line, as in the three-dimensional integrated device 10 shown in FIG. 1.

In the three-dimensional integrated device 20 shown in FIG. 2, other circuits provided on the integrated circuit substrates 27A, 27B, 27C and 27D are isolated in terms of electric emission by the ground planes 21A, 21B, 21C and 21D, minimizing interlayer crosstalk.

However, in the configuration shown in FIG. 2, the ground planes 21A, 21B, 21C and 21D may shield near-field electric fields but may not shield near-field magnetic fields.

Figure 3A:
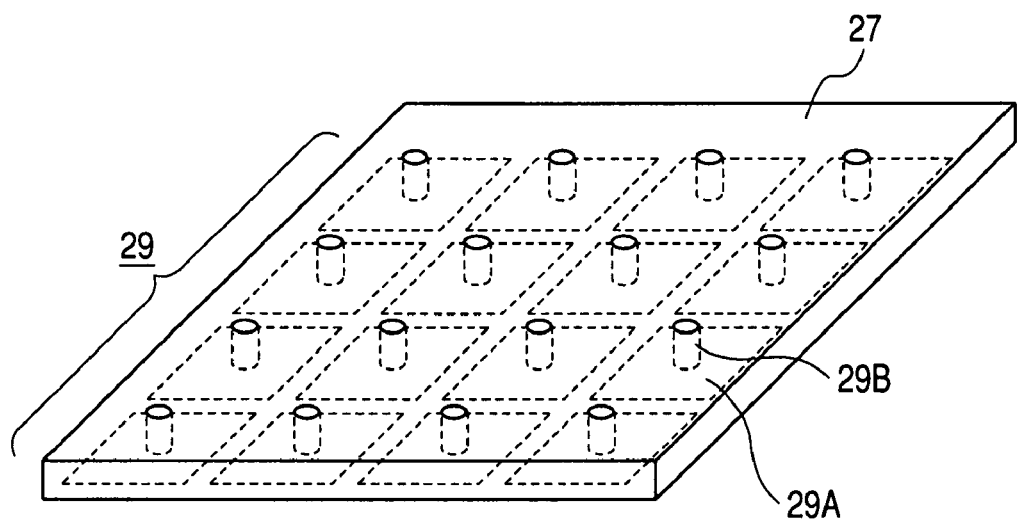
FIGS. 3A and 3B diagrammatically show a PBG structure formed on a silicon substrate.
Figure 3B:
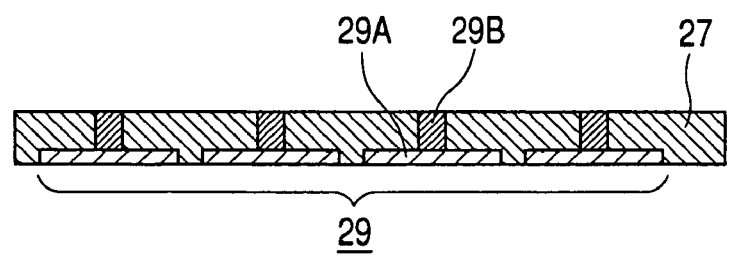

To address this problem, as shown in FIGS. 3A and 3B, the silicon substrate 27 that forms each of the laminated integrated circuit substrates 27A, 27B, 27C and 27D is used to configure a PBG (Photonic Band Gap) (or EBG; Electronic Band Gap) structure so as to shield the magnetic field as well.

Although a conductive silicon substrate inherently absorbs electromagnetic waves in a high frequency region, it is fortunately possible to use diffusion or ion implantation to create a P+ or N+ layer in a transistor formation process.

In this case, although the base substrate is desirably a high-resistance substrate, a P+ or N+ layer can be used to create a periodic structure having the same period as that of the communication wavelength on the back side of the substrate, as shown in FIGS. 3A and 3B, allowing formation of EBG. By particularly removing such structures at the portions corresponding to the communication elements of the laminated integrated circuit substrates, it is possible to enhance only partial coupling and suppress the leak of the magnetic field to unnecessary portions.

To create the PBG structure shown in FIGS. 3A and 3B, firstly, for example, a diffusion process or an ion implantation process is used to create the illustrated periodic structure, that is, a conductive layer 29A, on a desired surface of the silicon substrate 27.

Then, RIE (anisotropic etching) or the like is used to form through vias 29B in the silicon substrate 27. Thereafter, CVD or the like is used to coat the inner surfaces of the vias with insulating films as appropriate. Furthermore, plating or the like is used to make the inner surfaces of the vias conductive.

In this case, the silicon substrate 27 is desirably a high-resistance substrate, and the conductive through vias 29B are connected to the power supply or the ground on the integrated circuit substrate.

Thus, the silicon substrate 27 having the periodic structure 29, that is, the conductive layer 29A provided with the conductive through vias 29B, can be configured to shield a magnetic field.

In the example shown in FIG. 3, although diffusion or ion implantation is used to create the P+ or N+ layer or the like, the periodic structure may of course be created by depositing metal, such as Au, Cu and Al, on the back side.

Figure 4:
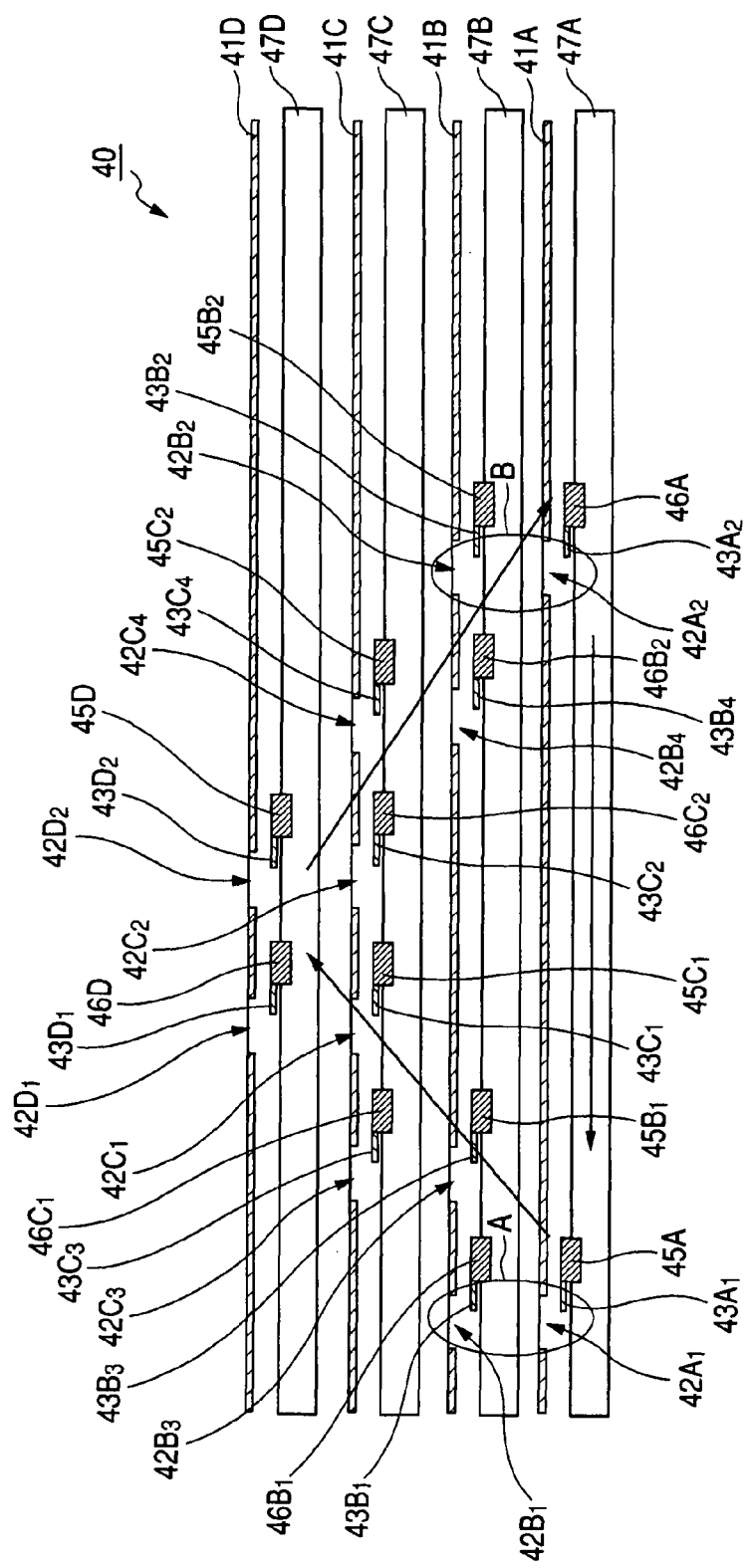
FIG. 4 is a cross-sectional view diagrammatically showing still another exemplary configuration of the three-dimensional integrated device to which the invention is applied.

In the three-dimensional integrated device 20 shown in FIG. 2, although the description has been made of the configuration of the integrated circuit substrates 27A, 27B, 27C and 27D in which the three sets $22A_1$ to $22D_1$, $22A_2$ to $22D_2$ and $22A_3$ to $22D_3$ vertically superimposed on each other function as communication channels A, B and C, each of which is capable of individually sending and receiving signals, the invention can be applied to a three-dimensional integrated device 40 having a ring bus configuration, as shown in FIG. 4.

The ring bus configuration of the three-dimensional integrated device 40 shown in FIG. 4 is obtained by sharing two apertures in integrated circuit substrates of four integrated circuit substrates 47A, 47B, 47C and 47D and successively sending and receiving signals between the integrated circuit substrates.

That is, the three-dimensional integrated device 40 includes the four integrated circuit substrates 47A, 47B, 47C and 47D laminated to each other. Each of the integrated circuit substrates 47A, 47B, 47C and 47D have one ground plane, that is, ground planes 41A, 41B, 41C and 41D, respectively. The integrated circuit substrates 47A, 47B, 47C and 47D also have two to four apertures $42A_1$, $42A_2$, $42B_1$ to $42B_4$, $42C_1$ to $42C_4$ and $42D_1$, $42D_2$ provided at desired locations in the ground planes 41A, 41B, 41C and 41D, open ends of microstrip lines $43A_1$, $43A_2$, $43B_1$ to $43B_4$, $43C_1$ to $43C_4$, and $43D_1$, $43D_2$ formed in pairs with the ground planes 41A, 41B, 41C and 41D and placed in the apertures $42A_1$, $42A_2$, $42B_1$ to $42B_4$, $42C_1$ to $42C_4$ and $42D_1$, $42D_2$, and transmitters 45A, $45B_2$, $45B_1$, $45C_1$, $45C_2$, 45D that are connected to the microstrip lines $43A_1$, $43B_2$, $43B_3$, $43C_1$, $43C_4$ and $43D_2$ and transmit signals at a frequency substantially corresponding to the perimeter λ of the apertures $42A_1$, $42B_2$, $42B_3$, $42C_1$, $42C_4$ and $42D_2$ and receivers 46A, $46B_1$, $46B_2$, $46C_2$, $46C_1$ and 46D that are connected to the microstrip lines $43A_2$, $43B_1$, $43B_4$, $43C_2$, $43D_3$ and $43D_1$ and receive signals at a frequency substantially corresponding to the perimeter λ of the apertures $42A_2$, $42B_1$, $42B_4$, $42C_2$, $42C_3$ and $42D_1$. The apertures $42A_1$, $42A_2$ in the integrated circuit substrate 47A and the apertures $42B_1$, $42B_2$ in the integrated circuit substrate 47B, the apertures $42B_3$, $42B_4$ in the integrated circuit substrate 47B and the apertures $42C_3$, $42C_4$ in the integrated circuit substrate 47C, the apertures $42C_1$, $42C_2$ in the integrated circuit substrate 47C and the apertures $42D_1$, $42D_2$ in the integrated circuit substrate 47D are disposed at the locations where the apertures of above respective combinations are superimposed on each other in the direction perpendicular to the ground planes 41A, 41B, 41C and 41D.

In the thus configured three-dimensional integrated device 40, transmission slots and reception slots are basically distinguished from each other. For example, the integrated circuit substrates 47C and 47D use a slot A to send signals from the integrated circuit substrate 47D to the integrated circuit substrate 47C, while a slot B is used to send signals from the integrated circuit substrate 47C to the integrated circuit substrate 47D.

By successively repeating this configuration upward and downward as shown in FIG. 4, a three-dimensional integrated device having a ring bus configuration is achieved.

Figure 5:
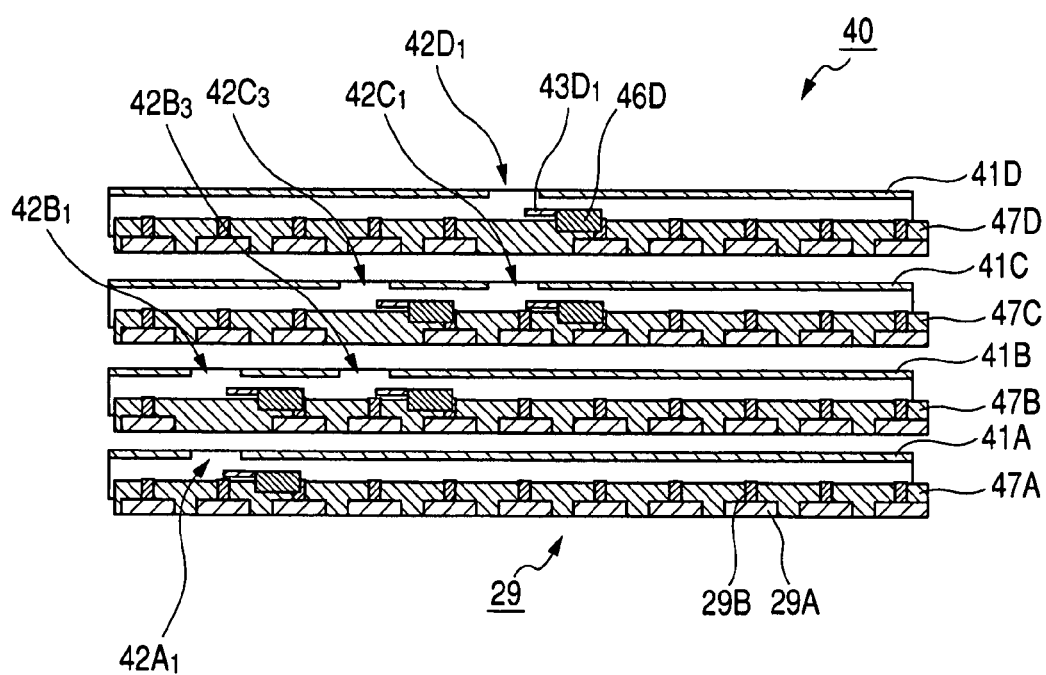
FIG. 5 is a cross-sectional view diagrammatically showing still another exemplary configuration of the three-dimensional integrated device having a PBG structure to which the invention is applied.

Furthermore, also in the three-dimensional integrated device 40 having such a ring bus configuration, as shown in FIG. 5, by creating the periodic structure 29, that is, the conductive layer 29A provided with the conductive through vias 29B in the silicon substrates that form the integrated circuit substrates 47A, 47B, 47C and 47D, as in the PBG structure shown in FIGS. 3A and 3B, near-field magnetic fields can be shielded. By removing the PBG structures at the portions corresponding to the apertures $42A_1$, $42A_2$, $42B_1$ to $42B_4$, $42C_1$ to $42C_4$ and $42D_1$, $42D_2$ in the integrated circuit substrates 47A, 47B, 47C and 47D, signals can be satisfactorily transported. Since the PBG structure suppresses dispersion of magnetic fields, interference between the channels and interference with the wiring on the integrated circuit substrate is suppressed, and interference with the wiring on the board on which the integrated circuit device is mounted and interference with other integrated circuit substrates can also be suppressed.

It should be understood by those skilled in the art that various modifications, combinations, sub-combinations and alterations may occur depending on design requirements and other factors insofar as they are within the scope of the appended claims or the equivalents thereof.

What is claimed is:

1. A three-dimensional integrated device comprising: at least two integrated circuit substrates laminated to each other, each of the integrated circuit substrates having at least one ground plane, at least one aperture provided in each ground plane, the end of microstrip line placed at a location corresponding to the aperture on a side of the substrate that is opposite the ground plane, and a transmitter and/or a receiver that is connected to the microstrip line, and further wherein there are a plurality of microstrip lines having corresponding apertures and transmitter and/or receiver elements located within the laminated circuit substrate.

wherein the substrates are laminated such that each of the apertures in each adjacent integrated circuit substrate is superimposed on at least one of the apertures in another immediately adjacent integrated circuit substrate in a direction perpendicular to the ground planes, wherein a ground plane side of each integrated circuit substrate is secured to a side of an adjacent integrated circuit substrate that is opposite its corresponding ground plane and signals are transported in a contactless manner between integrated circuit substrates through the apertures and signals are transferred through only single ground plane aperture when communication is effected directly between immediately adjacent integrated circuit substrates, and further wherein the respective microstrip lines of transmitter and receiver elements communicating with each other are arranged to be parallel with each other.

2. The three-dimensional integrated device according to claim 1, wherein at least one of the integrated circuit substrates has a pattern formed therein, the pattern having a periodic structure.

3. The three-dimensional integrated device according to claim 2, wherein the periodic structure is formed at the bottom of the silicon substrate, and the pattern in a conductive portion of the silicon substrate is created by utilizing the change in carrier concentration of the silicon substrate itself.

4. The three-dimensional integrated device according to claim 1, wherein each of the apertures has a corresponding transmitter and receiver for each substrate.

5. The three-dimensional integrated device according to claim 1, wherein each of the integrated circuit substrates has an aperture where a microstrip line connected to the transmitter is formed and an aperture where a microstrip line connected to the receiver is formed.

6. The three-dimensional integrated device according to claim 1, wherein each of the integrated circuit substrates is formed of a silicon substrate having at least one through via for power supply and ground wiring, and the integrated circuit substrates are laminated to each other through bumps electrically connected to the through via.

7. The three-dimensional integrated device according to claim 1, wherein one substrate simultaneously transfers signals to each of a plurality of integrated circuit substrates via a transmitter having its microstrip line located at an is located perpendicularly above or below apertures for each of the plurality of integrated circuit substrates to which the signals are simultaneously transferred.

8. The three-dimensional integrated device according to claim 1, wherein a plurality of substrates perform simultaneously signal transfer through a plurality of groups of apertures that are respectively perpendicularly stacked.

* * * * *